United States Patent [19]

Matsukura

[11] Patent Number: 5,072,280
[45] Date of Patent: Dec. 10, 1991

[54] RESIN SEALED SEMICONDUCTOR DEVICE

[75] Inventor: Takumi Matsukura, Tokyo, Japan

[73] Assignee: NEC Corporation, Tokyo, Japan

[21] Appl. No.: 602,032

[22] Filed: Oct. 23, 1990

[30] Foreign Application Priority Data

Oct. 23, 1989 [JP] Japan .................... 1-276834

[51] Int. Cl.⁵ .................... H01L 23/48; H01L 23/30; H01L 23/50
[52] U.S. Cl. ........................ 357/70; 357/72
[58] Field of Search ............ 357/70, 80, 68, 72

[56] References Cited

U.S. PATENT DOCUMENTS 4,862,245 8/1989 Pashby et al. .................... 357/70

FOREIGN PATENT DOCUMENTS 0194560 11/1982 Japan .................... 357/70
0082439 4/1986 Japan .................... 357/70
0235763 10/1987 Japan .................... 357/70

Primary Examiner—Rolf Hille
Assistant Examiner—S. V. Clark
Attorney, Agent, or Firm—Sughrue, Mion, Zinn, Macpeak & Seas

[57] ABSTRACT

A resin sealed semiconductor device includes leads of a lead frame having no semiconductor component mounting portion and fixed to an upper surface of a semiconductor element through insulating adhesive. Metal wires connect the leads to bonding pads of the semiconductor element and these components are resin-sealed. An insulating film is provided on a part of the upper surface of the lead so that the metal wire can cross the lead without making electrical contact.

9 Claims, 2 Drawing Sheets

RESIN SEALED SEMICONDUCTOR DEVICE

BACKGROUND OF THE INVENTION

The present invention relates to a resin sealed semiconductor device and, particularly, to a resin sealed semiconductor device in which a high integration density semiconductor element can be resin-sealed without changing package size.

A conventional resin sealed semiconductor device is assembled as following manner. For example, a semiconductor element is fixedly secured to a semiconductor element mounting portion of a lead frame made from a thin plate of iron alloy with using silver paste. Then, bonding pads on the semiconductor element are wire-bonded to leads also formed in the lead frame by using wires of metal such as gold or aluminum. Thereafter, the semiconductor element and the lead frame portion therearound are resin-sealed with epoxy resin and portions of the leads extended from the resin sealed portion are separated from the lead frame and are bent.

External dimensions (package size) of the resin sealed semiconductor device assembled in this manner are standardized by JEDEC (Joint of Electron Device Engineering Council) or EIAJ (Electronic Industries Association of Japan). Therefore, for resin sealing of a high integration density semiconductor element having large area, a ratio of a resin sealed portion of the package to the semiconductor element thereof becomes small. As a result, the distance between ends of leads and the semiconductor element becomes small and further the length of suspending leads for supporting the semiconductor element mounting portion also becomes small. Thus, the deep press machining for lowering the level of the semiconductor element mounting portion of the lead frame with respect to the remaining portion thereof becomes difficult.

For this reason, there is a problem that the metal wire for bonding the bonding pads of the semiconductor element to the leads may contact with edge portions of the element, resulting in electric short-circuit.

In order to solve this problem, the so-called LOC (Lead-On-Chip) construction such as shown in U.S. Pat. No. 4,862,245 has been proposed, in which a lead frame does not have a semiconductor component mounting portion and leads are overlapped on a semiconductor component. The leads protruded on the upper surface of the semiconductor elements are directly fixed to the upper surface through insulating adhesive.

To install many bonding pads on a semiconductor element, peripheral sections thereof are useful as bonding pad forming regions. In this case, however, leads (inner leads) pass through the peripheral section between bonding pads. Therefore, in wire-bonding with metal wire, there may be cases that bonding must be done in directions traversing the leads and thus the problem of electric short-circuit between the metal wire and the leads is likely to occur.

SUMMARY OF THE INVENTION

An object of the present invention is to provide a resin sealed semiconductor device in which a high integration density semiconductor element is resin-sealed without changing a package size.

Another object of the present invention is to provide a resin sealed semiconductor device where electric short-circuit of metal wire will not occur.

According to a present invention, there is provided a resin sealed semiconductor device which comprises a semiconductor element having an upper surface, and the semiconductor element includes bonding pads provided in a peripheral section of the upper surface. Leads (inner leads) pass through on the peripheral section of the upper surface of the semiconductor element between the bonding pads and are formed on a central section of the upper surface of the semiconductor element. The leads are fixedly attached to the upper surface of the semiconductor element via insulating adhesive and/or via an insulating substance, so that the lead frame has no element mounting portion. Metal wires connect respective first upper parts of the leads and corresponding ones of the bonding pads, respectively, such that at least one of the metal wires crosses over one of the leads. An insulating film is attached to a second upper part of the lead under the crossing metal wire, and resin is provided for sealing the semiconductor element, the leads and the metal wires as a unit. The insulating film which is beforehand formed may consist of a polyimide resin film coated with epoxy resin as adhesive.

Since the resin sealed semiconductor device according to the present invention makes connection of metal wire over the upper surfaces of the leads possible, there is no electric short-circuit between the metal wire and the inner leads. Further, for a high integration density, large sized semiconductor element requiring a large resin seal area, since there is no size limitation due to the fact that no semiconductor element mounting portion, it is possible to resin-seal the semiconductor device without changing the size of resin seal portion.

BRIEF DESCRIPTION OF THE DRAWINGS

The above-mentioned and other objects, features and advantages of the present invention will becomes apparent by reference to the following detailed description of the invention taken in conjunction with the accompanying drawings, wherein.

DETAILED DESCRIPTION OF THE PREFERRED EMBODIMENTS

Figure 1:
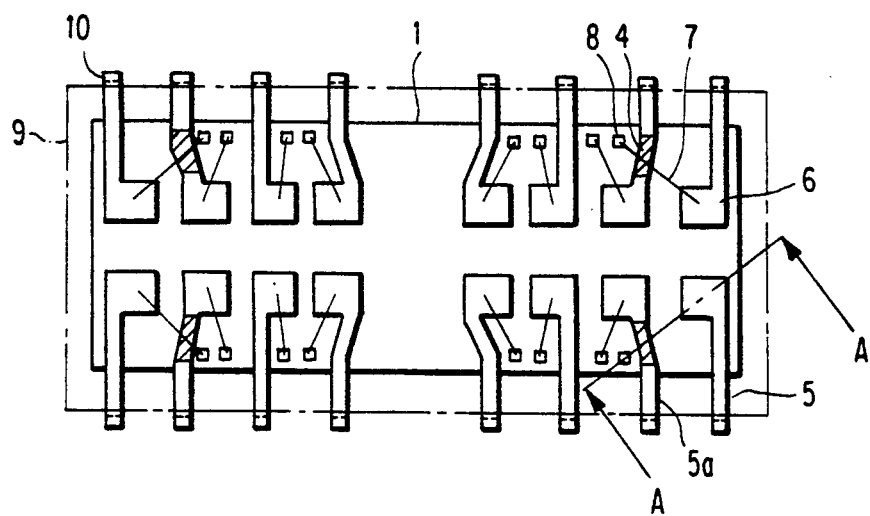
FIG. 1 is a plan view of a first embodiment of a resin sealed semiconductor device according to the present invention, showing an internal construction thereof.

A first embodiment of a resin sealed semiconductor device according to the present invention will be described with reference to FIGS. 1, 2 and 3. In FIG. 3, a lead frame 11 is formed by punching a thin plate of iron-nickel alloy or iron alloy such as Koval. The lead frame 11 has no semiconductor element mounting portion, but it has a plurality of leads 5 and 10.

In this specification, a portion of a lead which is to be included in a resin seal portion 9 (FIG. 1) is referred to as an inner lead 5 and the other portion thereof which is outside the resin seal portion 9 is referred to as an external or outer lead 10. Boundary portions of the leads between the inner leads 5 and the outer leads 10 are connected to each other by tie-bars 12 extending laterally with respect to the leads between outer frames 14. End portions of the outer leads 10 are connected to each other by tie-bars 13 extending laterally thereto between the outer frames 14. An end portion of each inner lead is enlarged in area to form a bonding region 6 and thus a plurality of bonding regions 6 are arranged in two lines. The lead frame 11 is silver-plated. To a back surface of the enlarged end portion 6 and of other parts of each inner lead 5, an insulating adhesive tape 3 having a three-layer structure and a thickness of 90 μm is adhered. The adhesive tape 3, for example, consists of a base material film of polyimide resin having a thickness of 50 μm as an insulator, and epoxy resin coating films as adhesive material having each thickness of 20 μm attached on opposite surfaces (upper and lower surfaces) of the polyimide resin film.

Onto a part 5a of certain ones of the inner leads 5, a heat resistive insulating film 4 durable to 150° C. to 200° C. is attached by heat under pressure. The insulating film 4 may be formed by coating a surface of a polyimide resin sheet of 50 μm thick with epoxy resin of 20 μm thick; the polyimide resin sheet functions mainly as an insulator and the epoxy resin functions mainly as an adhesive. The insulating film 4 is punched beforehand to have a configuration mating the inner lead 5a and attached onto parts of the upper surface of the inner lead 5a other than the enlarged portion 6 by heat under pressure.

Figure 2:
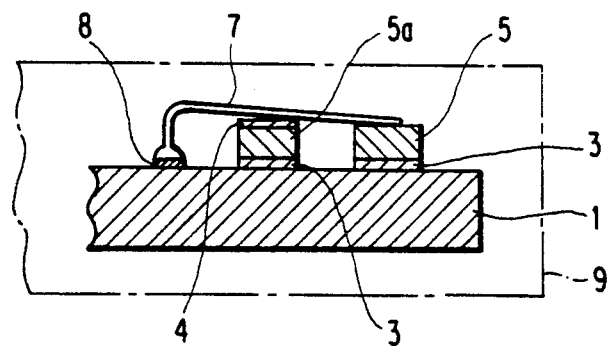
FIG. 2 is an enlarged cross section taken along a line A—A in FIG. 1.
Figure 3:
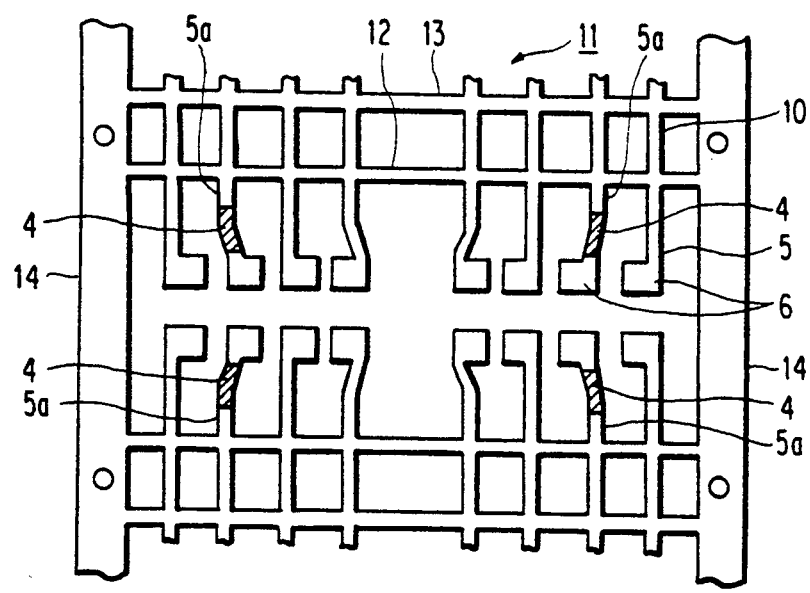
FIG. 3 is a plan view of a lead frame to be used in the first embodiment.

In FIGS. 1 and 2, the inner leads 5 are put on the upper surface of the semiconductor element 1 having associated circuits formed thereon, and the semiconductor element 1 and the inner leads 5 are fixed in position by adhering the insulating adhesives 3 on the lower surfaces of the enlarged portions 6 and other parts of the internal leads 5 and on the upper surface of the semiconductor element 1. The upper surface of the semiconductor element 1 is painted with polyimide resin (not shown) and portions of the latter on bonding pads 8 are removed by etching. In order to fixedly secure the internal leads 5 and the semiconductor element 1 to each other, they are pressed to each other under pressure of 200 g at a temperature of 150° C. and then baked at 150° C. to 200° C. for 1 to 2 hours. Further, metal wires 7 are bonded to the bonding pads 8 of the semiconductor element 1 and to the enlarged portions 6 of the inner leads 5 including leads 5a. In addition, the resin seal portion 9 is sealed with epoxy resin so that outer leads 10 are protruded from the sealing resin. Finally, the outer leads 10 are cut away from the outer frames 14 (FIG. 3) of the lead frame 11 and bent suitably, resulting in a resin sealed semiconductor device.

According to the first embodiment in which the insulating film 4 is attached to the upper surface of each inner lead 5a, the metal wires 7 do not, unfavorably make electrical contact with the inner leads 5a even when the wires traverse over the inner leads 5a.

Figure 4:
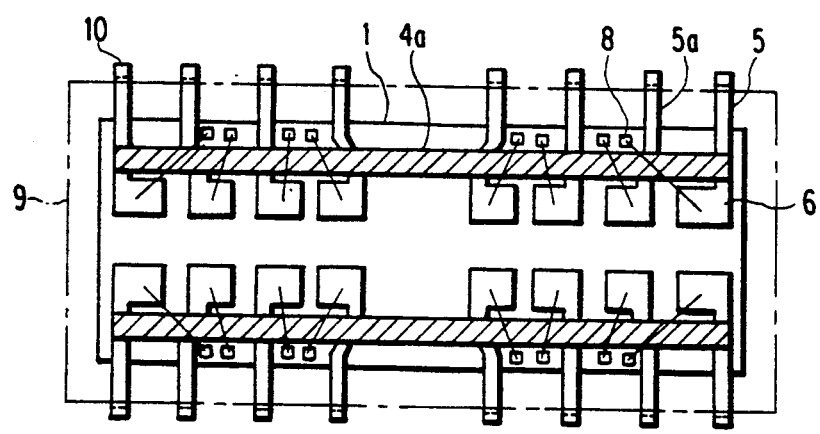
FIG. 4 is a plan view of a second embodiment of the resin sealed semiconductor device according to the present invention, showing an internal construction thereof.

FIG. 4 shows a second embodiment of the present invention. In FIG. 4, the same components as those in FIGS. 1 to 3 are indicated by the same reference numerals. Insulating strips 4a of the same material as the film 4 in the first embodiment traversing a plurality of inner leads 5 including leads 5a are attached thereto such that the insulating strips 4a do not cover the bonding pads 8 on the semiconductor element 1 or the metal wire connections 6 of the inner leads 5 and 5a. According to the second embodiment, since the portions of the insulating film to be punched out are minimized, machining of the insulating film is facilitated.

According to the present invention, the area ratio of the semiconductor element to the resin seal portion can be increased without changing the area of the resin seal portion. Further, since wire-bonding over the inner leads in traversing direction is possible, the freedom of bonding pad arrangement on the semiconductor element can be made large.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is, therefore, contemplated that the appended claims will cover any modifications or embodiments as fall within the true scope of the invention.

What is claimed is:

1. A resin sealed semiconductor device, comprising:
   a semiconductor element having an upper surface and a rectangular shape encircled by two long straight edges in parallel to each other and two short straight edges in parallel to each other, said semiconductor element including a plurality of bonding pads arranged in a line parallel with said long straight edges and formed on a peripheral section of said upper surface near one of said long straight edges;
   a lead frame of metal including a plurality of leads, said leads being fixedly attached to said upper surface of said semiconductor element through insulating adhesive, formed on a central section of said upper surface and extending on said peripheral section of said upper surface at portions remote from and between said bonding pads, and extracted from said one of said long straight edges outwardly, said leads having bonding areas positioned on said central section, said bonding areas of said leads being arranged on a line in parallel with said one of said long straight edges;
   a plurality of metal wires connecting said bonding areas of said leads and said bonding pads, respectively, a first metal wire among said plurality of metal wires being connected to said bonding area of a first lead among said plurality of leads, said first metal wire crosses above a second lead among said plurality of leads and connects to a first bonding pad among said plurality of bonding pads, said second lead being formed adjacent to said first lead and between said first lead and said first bonding pad;
   an insulating film having a strip shape, continuously extending in one direction in parallel with said long straight edges and attached to parts of an upper surface of said plurality of said leads, respectively, said part of said upper surface of said second lead being positioned under said first metal wire such that said first metal wire crosses above said second lead by interposing said insulating film; and resin for sealing said semiconductor element, said leads, said metal wires and said insulating film as a unit.

2. A resin sealed semiconductor device of claim 1, wherein said leads are terminated on said central section with a terminating part having a width wider than other parts of said leads and said bonding areas are positioned in said terminating parts, respectively.

3. A resin sealed semiconductor device of claim 1, further comprising a second bonding pad among said plurality of bonding pads and a second metal wire among said plurality of metal wires, where said second metal wire connects said bonding area of said second lead and said second bonding pad without crossing any other of said leads.

4. A resin sealed semiconductor device of claim 3, further comprising a third lead among said plurality of leads, said third lead being adjacent to said second lead, and said first and second bonding pads being formed between said second and third leads.

5. A resin sealed semiconductor device of claim 1, wherein said insulating film consists of a polyimide resin film coated with epoxy resin.

6. A resin sealed semiconductor device, comprising:

a semiconductor element having an upper surface and a rectangular shape encircled by first and second long straight edges in parallel to each other and first and second short straight edges in parallel to each other, said semiconductor element including a first group of bonding pads arranged in a first row line parallel with said first long straight edge and positioned at a first peripheral section of said upper surface near said first long straight edge and a second group of bonding pads arranged in a second row line in parallel with said second long straight edge and positioned at a second peripheral section of said upper surface near said second long straight edge;

first and second groups of leads each being fixedly attached to said upper surface of said semiconductor element through insulating adhesive, said first group leads being formed on said first peripheral section and positioned to avoid contact with said first group bonding pads, said first group leads extending inwardly beyond said first row line and forming bonding areas respectively, on a central section of said upper surface, said bonding areas of said first group leads being arranged in a third row line in parallel with said first long straight edge and more remote from said first long straight edge than said first row line, said second group leads being formed on said second peripheral section and positioned to avoid contact with said second group bonding pads, said second group leads extending inwardly beyond said second row line and forming bonding areas, respectively, on said central section of said upper surface, said bonding areas of said second group leads being arranged in a fourth row line in parallel with said second long straight edge and more remote from said second long straight edge than said second row line;

first, second, third and fourth groups of bonding wires, each of said first group bonding wires being connected to said bonding area of one of said first group leads by crossing over one of said leads adjacent to said one of said first group leads and connected to one of said first group bonding pads, each of said second group bonding wires being connected to said bonding area of one of said first group leads and connected to one of said first group bonding pads without crossing any of said leads, each of said third group bonding wires being connected to said bonding area of one of said second group leads by crossing over one of said leads adjacent to said one of said second group leads and connected to one of said second group bonding pads, each of said fourth group bonding wires being connected to said bonding area of one of said second group leads and connected to one of said second group bonding pads without crossing any lead;

insulating films attached to upper surfaces of said first and second group leads under said first and third group bonding wires crossing over said upper surfaces; and resin for sealing said semiconductor element, said first and second group leads, said first, second, third and fourth bonding wires and said insulating films as a unit.

7. A resin sealed semiconductor device of claim 6, wherein each of said first and second group leads is terminated on said central section with a terminating part having a width wider than other parts of said leads and each of said bonding areas of said first and second group leads is positioned at said terminating part.

8. A resin sealed semiconductor device of claim 6, wherein said insulating films extend continuously in one direction in parallel with said first and second long straight edge of said semiconductor element such that they cover parts of said first and second group leads, respectively.

9. A resin sealed semiconductor device of claim 6, wherein said insulating films consist of polyimide resin films coated with epoxy resin.

* * * * *